United States Patent [19]

Nelson

[11] Patent Number: 4,497,687

[45] Date of Patent: Feb. 5, 1985

[54] AQUEOUS PROCESS FOR ETCHING COOPER AND OTHER METALS

[75] Inventor: Norvell J. Nelson, Palo Alto, Calif.

[73] Assignee: Psi Star, Inc., Hayward, Calif.

[21] Appl. No.: 563,683

[22] Filed: Dec. 20, 1983

Related U.S. Application Data

[63] Continuation-in-part of Ser. No. 517,943, Jul. 28, 1983, , which is a continuation-in-part of Ser. No. 501,159, Jun. 6, 1983.

[51] Int. Cl.³ .................... C23F 1/02; B44C 1/22; C03C 15/00; C03C 25/06
[52] U.S. Cl. .................... 156/659.1; 156/656; 156/664; 156/666; 156/902; 252/79.2; 252/79.4
[58] Field of Search .............. 156/656, 659.1, 664, 156/666, 901, 902, 640; 252/79.2, 79.4, 142, 146, 79.1; 134/3, 41

[56] References Cited

U.S. PATENT DOCUMENTS

| | | | |
|---|---|---|---|
| 1,994,499 | 3/1935 | Boller | 252/79.2 X |
| 2,428,464 | 10/1947 | Lum et al. | 252/79.2 |
| 2,647,864 | 8/1953 | Goffredo | 252/79.2 X |
| 2,798,047 | 7/1957 | Touey et al. | 252/544 |
| 2,887,373 | 5/1959 | Winkler et al. | 156/664 X |
| 2,908,557 | 10/1959 | Black et al. | 252/79.2 X |
| 2,947,615 | 8/1960 | Greene et al. | 156/646 |
| 3,373,113 | 3/1968 | Achenbach | 156/666 |
| 3,449,255 | 6/1969 | Johnston | 252/544 |
| 3,518,132 | 6/1970 | Glendinning | 156/646 |
| 3,773,578 | 1/1973 | Glendinning et al. | 156/646 |
| 4,007,037 | 2/1977 | Lukes et al. | 156/666 |

OTHER PUBLICATIONS

Kirk–Othmer, vol. 1, pp. 312, 313, 326 and 327, and vol. 5, pp. 145–149 (1979), Encyclopedia of Chemical Technology.

Primary Examiner—William A. Powell
Attorney, Agent, or Firm—Flehr, Hohbach, Test, Albritton & Herbert

[57] ABSTRACT

Nitrogen dioxide process for etching copper and other metals, using water as a catalyst/solvent. In one disclosed embodiment, a film of water is formed on the surface of the metal, and the water-covered metal is exposed to gaseous $NO_2$ to dissolve the metal. In another embodiment, the metal is exposed to an aqueous solution of $NO_2$ or $HNO_3$ in water, either by immersion or by spraying, to remove the metal.

36 Claims, No Drawings

AQUEOUS PROCESS FOR ETCHING COOPER AND OTHER METALS

This is a continuation-in-part of Ser. No. 517,943, filed July 28, 1983, which is a continuation-in-part of Ser. No. 501,159, filed June 6, 1983.

This invention pertains generally to the etching of metals, and more particularly to a process for removing copper and other metals in the manufacture of printed circuit boards.

Application Ser. No. 450,685, filed Dec. 17, 1982, describes a process for etching patterns in laminated copper foils using a gaseous nitrogen dioxide oxidant and an organic catalyst/solvent. This approach dramatically simplifies the chemical etching step in printed circuit board production compared to the wet etching processes currently in use. It uses a simpler chemistry having fewer process variables, it is less corrosive and thus permits the use of standard materials for processing equipment, and it produces less pollution and yields a single pure oxidized copper specie which is readily disposed of.

However, notwithstanding these substantial advantages, the process has been found to have certain limitations and disadvantages which might limit its large scale development and commercialization. For each mole of copper reacted, $\frac{2}{3}$ mole of gaseous NO are produced, and this causes considerable bubbling and foaming in the catalyst/solvent layer which interferes with the reaction by separating the reacting layer from the copper. This, in turn, leads to non-uniform specific area reaction rates, since areas having more exposed copper also have more vigorous gasing, thus reducing the copper removal in these areas.

This system also has somewhat of a thermodynamic explosion potential in that a rapid and uncontrolled reaction between $NO_2$ and the organic solvent mixture is energetically favored, although the reaction of metals and $NO_2$ in organic solvents has been studied extensively without mishap.

In addition, the reaction of copper metal with $NO_2$ is highly exothermic, producing an excess of 80 kilocalories per mole of copper reacted. The reaction is somewhat adiabatic, that is, the heat of reaction is primarily absorbed by the system. Hence, the temperature of the board increases rapidly during the reaction, and this limits the thickness of the copper foil which can be removed. Under conditions explored to date, the thickest foil which can be removed by the adiabatic gas reaction appears to be about $\frac{1}{2}$ oz./ft$^2$, or a thickness of about 0.007" (18 microns). Attempts to etch thicker foils produce disappointing results in that either the reaction film goes dry giving an incomplete etch or the substrate overheats, damaging the resist which destroys the pattern.

It has now been found, somewhat surprisingly, that these problems can be overcome and that even more improved results can be obtained by utilizing water as a catalyst/solvent in the etching of copper and other metals with nitrogen dioxide in the manufacture of printed circuit boards. This discovery is surprising and unexpected because $NO_2$ reacts with water to produce nitric acid which tends to attack both photoresist and substrate materials, two fatal problems in the manufacture of circuit boards. However, it has been found that by proper control of the process conditions, copper and other metal can be removed rapidly from circuit boards without damage to either the photoresist or the substrate, using an aqueous solution of either $NO_2$ or $HNO_3$ as an oxidant.

It is in general an object of the invention to provide a new and improved process for etching copper and other metals in the manufacture of printed circuit boards and in other applications.

Another object of the invention is to provide a process of the above character which overcomes the limitations and disadvantages of copper etching processes heretofore provided.

Another object of the invention is to provide a process of the above character which is inexpensive and easy to carry out.

These and other objects are achieved in accordance with the invention by utilizing water as a catalyst/solvent in the etching of copper and other metals with nitrogen dioxide. In one disclosed embodiment, a film of water is formed on the surface of the metal, and the water-coated metal is exposed to gaseous $NO_2$ to dissolve the metal. In another disclosed embodiment, the metal is exposed to an aqueous solution of $NO_2$ or $HNO_3$ and water, either by immersion or by spraying to remove the metal. In either embodiment, a polymer additive can be employed to prevent undercutting or etching of the metal in a direction parallel to its surface.

In the etching process of the invention, the oxidation of copper takes place according to the following reaction:

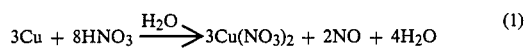

$$3Cu + 8HNO_3 \xrightarrow{H_2O} 3Cu(NO_3)_2 + 2NO + 4H_2O \quad (1)$$

which does not proceed in the absence of a suitable catalyst.

Since the reaction of $NO_2$ with water superimposes the relatively complex nitric acid forming chemistry upon the desired copper etching chemistry, it may be helpful in understanding the invention to consider some aspects of the nitric acid chemistry. The overall process by which nitric acid is formed is given in the following equation:

$$3NO_2 + H_2O \rightleftharpoons 2HNO_3 + NO, \quad (2)$$

which is the sum of at least three independent steps represented by the following equations:

$$N_2O_4 \rightleftharpoons NO^+ + NO_3^- \quad (3)$$

$$NO^+ + H_2O \rightleftharpoons H^+ + HONO \quad (4)$$

$$HONO + NO_2 \rightleftharpoons NO + HNO_3 \quad (5)$$

It is important to note that all of these processes, including reaction (2), are readily reversible. The formation of nitric acid is favored by high $NO_2$ pressures while it is retarded and even destroyed by gaseous NO.

With gaseous $NO_2$ and a copper foil circuit board (with resist patterns), the invention is carried out by covering the board with a thin film of water (e.g., 0.025" or less for a $\frac{1}{2}$ oz./ft$^2$ laminate) prior to exposure to the $NO_2$. The circuit board is exposed to the $NO_2$ at room temperature, and the etching process is found to begin almost immediately and to be substantially complete within 2–3 minutes. At the end of the reaction, the board is covered with a thin film of concentrated copper nitrate which can be readily removed by a number of methods. Since the Cu product is in aqueous solution with nitrate as the only anion, the board can be made free of all residue by a simple water wash because there are no Cu(I) species present. Since it is difficult to form a uniform thin film with pure water, a polymer additive with a surfactant co-promotor is employed to lower the surface tension and increase the viscosity of the medium so that a uniform thin film can be obtained. The additives are selected to promote the anisotropic etching of copper foil so that the desired pattern can be obtained with little or no undercutting of the copper. Suitable polymers include water soluble polyacrylamides such as the cationic Dow Chemical Separan CP-7HS and Hercules Reten 210, the neutral Hercules Reten 520 and the anionic Dow Chemical MG 700. Also included are water soluble poly(acrylic acids) such as Aldrich Chemical #18, 127-7 and Rohm and Haas Acrysol A5 and carboxymethyl-cellulose such as Hercules 12M31. Suitable surfactants include DuPont surfactants Zonyl FSC, Zonyl FSN, Zonyl FSP and Zonyl FSK, 3M Fluorad surfactant FC-135, Sherex, Adogen 477, and hexadecyltrimethyl-ammonium bromide.

The following examples demonstrate the use of a water film to catalyze the etching of copper by gaseous $NO_2$, and they also show the influence of the polymer additive on the rate and course of the reaction:

EXAMPLE 1

A 3"×4" board with a laminated layer of ½ oz. copper per $ft^2$ having a test pattern of imaged Dynachem Laminar-ML dry film photoresist was coated with 3.9 g of a 0.7% solution of Dow Chemical Separan CP-7HS polymer in water. This composite was then exposed to gaseous $NO_2$ at 23° C. for 2 minutes. After an additional minute, the reaction mixture was washed from the board with a simple water rinse. It was found that over 0.8 g of Cu had been removed, essentially all of the exposed Cu in the test pattern area, with virtually no undercutting of the pattern defined by the photoresist.

EXAMPLE 2

The process of Example 1 was repeated using a test sample having an etch pattern defined by an 4 micron thick layer of Kodak 752 Microresist. Under the same reaction conditions, over 0.8 of Cu was removed in the area defined by the test pattern. The etching action was such that lines having substantially vertical sides were produced, although this sample was slightly undercut compared to that in Example 1.

EXAMPLE 3

The process of Example 1 was repeated using a similar test panel. This test sample was covered with 4.0 g of a 0.35% solution of Separan CP-7HS in water. This sample was exposed to $NO_2$ for 1½ minutes, and the reaction layer was removed by a water rinse after an additional 30 seconds. Again, 0.8 g of Cu was removed, substantially all the exposed copper in the test pattern area, with virtually no observed undercutting of the lines delineated by the test pattern.

EXAMPLE 4

The process of Example 1 was repeated, using a similar test panel. This sample was coated with 4.1 g layer of a 1% solution of Hercules 12M31 carboxymethyl-cellulose in water. This sample was exposed to $NO_2$ for 2 minutes, and the reaction layer was removed with a water rinse after an additional minute. It was found that 0.3 g of Cu was removed from the test area, about 40% of the exposed copper. While the etching of the pattern was incomplete, there was virtually no undercutting of the lines protected by the photoresist.

With nitrogen dioxide in an aqueous solution, the process looks even more like a nitric acid etching process given the facile equilibria relating $H_2O$, $NO_2$ and $HNO_3$, i.e. equations (2)–(5). Nitric acid is a good oxidant and a strong acid, and it is destructive of organic materials such as photoresist and glass epoxy circuit boards. A system with good oxidizing power and attenuated acidity, i.e. lower $HNO_3$ concentration, should oxidize the copper without destroying the organic components. Fairly concentrated nitric acid is required for reaction with copper because pure $HNO_3$ in itself is unreactive toward copper. For the reaction of equation (1) to occur, the nitric acid must contain some dissolved nitrogen oxides. Hence, the reaction probably proceeds through $NO^+$ (or $NO_2^+$ in extremely concentrated $HNO_3$) arising from equations (3), (4) and (5). From these equations, it can be seen that high acid ($H^+$) concentrations will promote high $NO^+$ concentrations, driving equation (4) backward. This indicates that a $H_2O$, $NO_2$, $HNO_3$ system should be highly acidic in order to be reasonably reactive toward copper. Unfortunately, such a system will also be reactive toward organic materials.

It has been found that the $NO^+$ concentration can be maximized without high acidity by reducing the water concentration and its chemical potential. This is achieved by using a copper salt such as $Cu(NO_3)_2$, the copper reaction product. Copper (II) nitrate is extremely soluble in water; about 380 g of the salt $Cu(NO_3)_2 \cdot 3H_2O$ will dissolve in 100 ml of water at 40° C. Any other salt of copper which is soluble in $HNO_3$ can likewise be used. Suitable salts include $CuSO_4$, copper (II) tetrafluoroborate, $CuCl_2$ and combinations thereof. With any of these salts, it is the copper ion $Cu^{++}$ which removes the water molecule from solution and makes it possible to etch with $HNO_3$.

By using concentrated solutions of $Cu(NO_3)_2$ in water as the reaction solvent, patterns can be rapidly etched in copper laminate foils without damage to resists or substrates, using either $NO_2$ or $HNO_3$ as the oxidant with both spray and immersion techniques. The added $NO_2(N_2O_4)$ or $HNO_3$ is the sole source of oxidizing power in the system. Hence, facile control of the etching parameters is readily obtained. In contrast to other commercial wet etching processes, the copper substrate is indifferent to the reaction medium (concentrated aqueous $Cu(NO_3)_2$) in the absence of added oxidizer.

Due to the rapid interconversion between $NO_2$ and $HNO_3$ in the system chemistry, it is possible to use solutions of $HNO_3$ for copper oxidation. $HNO_3$ is less expensive than pure $NO_2$ and is already in water solution, thus saving the expense of removing the heat of reaction of $NO_2$ with water. This water is absorbed by the reacting copper and is retained in the hydrated salt.

Use of this process for the etching of copper patterns in circuit board foil is illustrated in the following examples:

EXAMPLE 5

A 3"×4" board having a ½ oz./$ft^2$ copper laminate with a resist pattern formed from Kodak 752 Microresist was sprayed with a mixture of 10 cc of 90% $HNO_3$, and 50 cc of about 0.7% solution of Separan CP-7HS in water, diluted with about 225 cc of a 40% by weight solution of $Cu(NO_3)_2$ at 30°–35° C. The solution was recycled once. At the end of this time substantially all of the copper was removed from the pattern area with no undercutting of the resist pattern and no damage to the resist or substrate.

EXAMPLE 6

A 3″×4″ board with a resist pattern formed with Dynachem Laminar-ML film was sprayed with the solution of Example 1 after aging for 24 hours and replenishing with 40 cc of 90% $HNO_3$. The board was sprayed with this solution at a rapid rate and was substantially cleared of all Cu in the pattern area after 150 cc of solution was used. Again, no resist or substrate damage was noted. The pattern lines were very slightly undercut.

EXAMPLE 7

The process of Example 6 was repeated with an identical sample except that the same reaction solution was diluted with 25 cc of a 1.4% solution of Separan CP-7HS in water. Again, the copper was substantially removed from the pattern area after use of 150 cc of solution. No resist or substrate damage was observed, and no undercutting of the resist pattern was noted.

EXAMPLE 8

The solution of Example 7 was replenished with 5 cc of 90% $HNO_3$ and 20 cc of 1.4% Separan CP-7HS after the solution had aged 24 hours. A 3″×4″ board having a resist pattern formed from Dynachem Laminar-ML film was immersed in this solution with agitation. The copper unprotected by the resist pattern was completely removed in less than 2 minutes at 25° C. There was no resist or substrate damage evident, and there was no noticeable undercutting of the resist pattern.

Similar results were obtained when $NO_2$ was substituted for $HNO_3$ in the $Cu(NO_3)_2$ solution.

This process is advantageous in that it requires very few chemical components and, thus, affords relatively simple process control. It is particularly suitable for use with thicker copper foils, i.e. foils thicker than ½ oz./ft². Corrosion problems are minimized, and special materials such as titanium are not required for the processing equipment. The chemistry is clean, and the reaction product is extremely stable with no Cu(I) compounds to generate an insoluble sludge. Copper is removed as pure $Cu(NO_3)_2 \cdot 0.3H_2O$ which has some market value itself. If a mixture of $Cu(NO_3)_2$ and $CuSO_4$ is used as a buffer, the $CuSO_4 \cdot 5H_2O$ will precipitate first. The process can be operated as a closed system, thus reducing pollution problems. The process consumes only low cost nitric acid, which is a readily available major commodity chemical, and it runs under mild conditions, i.e. low temperatures. When the etching solution becomes too concentrated in $Cu(NO_3)_2$, it can be precipitated from the solution by cooling the solution to around 10° C. or by heating it to around 50° C.

Other metals which can be etched by this process include vanadium, manganese, iron, cobalt, nickel, palladium, and alloys of these metals such as constantan and Monel. With each of these metals, $Cu(NO_3)_2$ can be employed as in the etching of copper to maintain control of the reaction. Alternatively, a nitrate of the metal being etched can be utilized instead of $Cu(NO_3)_2$. Thus, for example, $Ni(NO_3)_2$ and $Mn(NO_3)_2$ can be used in the etching of nickel and manganese, respectively, and $Ni(NO_3)_2$ can also be used in the etching of nickel alloys.

EXAMPLE 9—Nickel

A solution of 500 cc of 50% nickel nitrate ($Ni(NO_3)_2$) 125 cc of 70% nitric acid ($HNO_3$) and 20 cc of 7% Separan CP-7HS (Dow Chemical polyacrylamide) heated to 45° C. was used to etch a 1″×6″ piece of nickel foil. About 0.37 g of Ni was removed in 10 minutes; at 50° C. 0.28 g of Ni was removed in 5 minutes.

EXAMPLE 10-Nickel

A solution of 4 liters of 50% $Cu(NO_3)_2$ in water, 1.2 liters of 70% $HNO_3$ and 200 cc of a 0.9% solution of Separan MG 700 (Dow Chemical poly(acrylamide)) was heated to 45° C. and used to etch a 1″×6″ piece of nickel foil. About 0.36 g of Ni was removed in 1 minute.

EXAMPLE 11-Constantan

The solution, of Example 10 above, was used to etch a 4½″ long piece of 20 gauge constantan (a Ni/Cu alloy) wire. About 0.068 g of material was etched in 1 minute, an additional 2 minutes of reaction removed another 0.137 g of material.

In etching copper circuit boards protected with a lead-tin solder resist, appreciable chemical reaction of the resist can be prevented by the addition of a small amount of phosphoric acid or any other phosphate to the etching solutions disclosed herein, e.g. nitric acid and copper nitrate with a polymer and surfactant. With these additives, there is virtually no undercutting of the solder etch mask, and this offers a significant improvement over existing etch processes used for the production of plated-copper circuit boards. Moreover, it has been found that the addition of a fluorocarbon phosphate such as Zonyl FSP detergent to the phosphoric acid makes the solder even less reactive, and it is believed that the surface of the resist becomes covered with a lead phosphate.

EXAMPLE 12

A solution of 3 liters of $Cu(NO_3)_2$ in water, specific gravity 1.50 at 20° C., 1 liter of 70% $HNO_3$, 500 cc of 85% $H_3PO_4$, 15 cc of 3M Fluorad FC-135 (a cationic fluorocarbon surfactant), 10 cc of DuPont Zonyl FSP (a fluorocarbon phosphate), and 150 cc of a 1.1% solution of Reten 520 (a Hercules polyacrylamide) was heated to 40° C. and used to etch a 4″×6″ panel of copper laminate having a solder etch resist pattern. The 1.4 mil layer of copper not covered by the solder pattern was removed in 3 minutes. Examination of a cross-section of this pattern showed that the copper was removed without noticeable undercutting of the solder resist pattern.

It is apparent from the foregoing that a new and improved process for etching copper has been provided. While only certain presently preferred embodiments have been described in detail, as will be apparent to those familiar with the art, certain changes and modifications can be made without departing from the scope of the invention as defined by the following claims.

I claim:
1. In a process for etching copper, the steps of: forming a film of water on the surface of the copper, and exposing the water-covered copper to gaseous $NO_2$ for a time sufficient to dissolve the copper.
2. The process of claim 1 wherein the film of water is formed on the copper by applying a mixture of water and an additive which serves both as a surfactant and as an inhibitor of etching in a direction parallel to the surface of the copper.

3. The process of claim 2 wherein the additive comprises a polymer.

4. The process of claim 3 wherein the polymer is selected from the group consisting of a water-soluble polyacrylamide, a carboxymethyl-cellulose, and poly(acrylic acid).

5. The process of claim 3 wherein the polymer comprises a cationic water-soluble polyacrylamide.

6. The process of claim 2 wherein the additive is a cationic surfactant.

7. In a process for removing copper from a printed circuit board having a substrate beneath the copper and etch resist material covering a portion of the copper to be retained, contacting the board with an aqueous solution of $NO_2$ or $HNO_3$, and including a sufficient quantity of a dissolved copper salt in the solution to prevent attack of the substrate or the etch resist material as the copper is removed.

8. The process of claim 7 wherein the copper salt is selected from the group consisting of $Cu(NO_3)_2$, $CuSO_4$, copper (II) tetrafluoroborate, $CuCl_2$ and combinations thereof.

9. catalyst/solvent for use in the etching of copper with gaseous $NO_2$, comprising a mixture of water and an additive which serves as a surfactant and as an inhibitor of etching in a direction parallel to the surface of the copper.

10. The catalyst/solvent of claim 9 wherein the additive comprises a polymer.

11. The catalyst/solvent of claim 10 wherein the polymer is selected from the group consisting of a water-soluble polyacrylamide, a carboxymethyl-cellulose, and poly (acrylic acid).

12. The catalyst/solvent of claim 10 wherein the polymer comprises a cationic water-soluble polyacrylamide.

13. In a process for etching a metal on a substrate: exposing the metal to an aqueous solution of $NO_2$ or $HNO_3$ containing a sufficient quantity of a metal nitrate to prevent etching of the substrate as the metal is dissolved.

14. The process of claim 13 wherein the metal is selected from the group consisting of copper, vanadium, manganese, iron, cobalt, nickel, palladium, and alloys thereof.

15. The process of claim 13 wherein the nitrate contained in the solution is $Cu(NO_3)_2$.

16. The process of claim 13 wherein the nitrate contained in the solution is a nitrate of the metal being etched.

17. In a process for etching copper having a lead-tin solder mask covering a portion thereof, the steps of: forming a film of water on the surface of the copper by applying an aqueous solution containing a surfactant, an additive which inhibits etching of the copper at a direction parallel to the surface and a phosphate which prevents etching of the solder mask, and exposing the water-covered copper to gaseous $NO_2$ for a time sufficient to dissolve the copper which is not covered by the solder mask.

18. The process of claim 17 wherein the aqueous solution contains both phosphoric acid and another phosphate.

19. In a process for removing copper from a printed circuit board having a substrate beneath the copper and a lead-tin solder mask covering a portion of the copper, contacting the board with an aqueous solution of $NO_2$ or $HNO_3$, a sufficient quantity of a dissolved copper salt to prevent etching of the substrate, and a phosphate to prevent etching of the solder mask.

20. The process of claim 19 wherein the aqueous solution contains phosphoric acid and another phosphate.

21. A catalyst/solvent for use in the etching of copper with gaseous $NO_2$, comprising a mixture of water, a phosphate, a surfactant and an additive which inhibits etching in a direction parallel to the surface of the copper.

22. The catalyst/solvent of claim 21 including phosphoric acid and another phosphate.

23. In a process of etching a metal having a lead-tin solder mask covering a portion thereof: exposing the metal to an aqueous solution of $NO_2$ or $HNO_3$ containing a metal nitrate and a phosphate to dissolve the exposed metal.

24. The process of claim 23 wherein the aqueous solution contains phosphoric acid and another phosphate.

25. In a process for removing copper from a printed circuit board having a substrate beneath the copper and etch resist material covering a portion of the copper to be retained, contacting the board with an aqueous solution of $NO_2$ or $HNO_3$, a sufficient quantity of a dissolved copper salt to prevent attack of the substrate or the etch resist material as the copper is removed, and a polymer additive which prevents undercutting of the copper as it is etched.

26. The process of claim 25 wherein the polymer is selected from the group consisting of a water-soluble polyacrylamide, a carboxymethyl-cellulose, and poly (acrylic acid).

27. The process of claim 25 wherein the polymer comprises a cationic water-soluble polyacrylamide.

28. The process of claim 25 wherein the aqueous solution comprises 0.5–2.0 units by weight of 10%–100% $HNO_3$ in water, 2.5–10 units by weight of 0.1–1.0% solution of a water-soluble acrylamide polymer in water, and 11–44 units by weight of a 10–60% solution of $Cu(NO_3)_2$ in water.

29. In an aqueous solution for etching copper: $NO_2$ or $HNO_3$, a dissolved copper salt, a surfactant and an additive to inhibit undercutting of the copper as it is etched.

30. The solution of claim 29 wherein the surfactant and the additive are a polymer.

31. The solution of claim 30 wherein the polymer is selected from a group consisting of a water-soluble polyacrylamide, a carboxymethyl-cellulose, and poly (acrylic acid).

32. The solution of claim 29 wherein the solution also contains a phosphate.

33. The solution of claim 29 wherein the solution also contains phosphoric acid and another phosphate.

34. In a process for removing a selected portion of copper from a printed circuit board having a substrate beneath the copper and a mask covering another portion of the copper: contacting the board with an aqueous solution of $NO_2$ or $HNO_3$, a sufficient amount of a dissolved copper salt to prevent etching of the substrate, a surfactant and an additive which inhibits undercutting of the copper beneath the mask.

35. The process of claim 34 wherein the mask comprises a lead-tin solder mask, and the aqueous solution also includes a phosphate.

36. The process of claim 35 wherein the solution contains both phosphoric acid and another phosphate.

* * * * *